US006783627B1

(12) United States Patent
Mahawili (10) Patent No.: US 6,783,627 B1
(45) Date of Patent: Aug. 31, 2004

(54) REACTOR WITH REMOTE PLASMA SYSTEM AND METHOD OF PROCESSING A SEMICONDUCTOR SUBSTRATE

(75) Inventor: Imad Mahawili, Grand Rapids, MI (US)

(73) Assignee: Kokusai Semiconductor Equipment Corporation, San Jose, CA (US)

( * ) Notice: Subject to any disclaimer, the term of this patent is extended or adjusted under 35 U.S.C. 154(b) by 0 days.

(21) Appl. No.: 09/488,309

(22) Filed: Jan. 20, 2000

(51) Int. Cl.$^7$ .......................... C22F 1/00; H01L 21/302
(52) U.S. Cl. ............................ 156/345.38; 156/345.33; 156/345.35; 156/345.48; 156/345.52; 118/723 IR; 118/723 ME; 118/725
(58) Field of Search .................... 118/724, 725, 118/723 MW, 723 I, 723 IR, 723 ME, 723 W; 156/345.33, 345.35, 345.38, 345.48, 345.52, 345; 216/68, 69, 79, 80, 71; 427/532, 533, 534, 574, 573; 134/1.2

(56) References Cited

U.S. PATENT DOCUMENTS

| | | | |
|---|---|---|---|
| 4,540,868 A | 9/1985 | Liebing | 219/121 |
| 4,550,684 A | 11/1985 | Mahawili | 118/724 |
| 4,596,718 A | 6/1986 | Gruner | 427/34 |
| 4,680,447 A | 7/1987 | Mahawili | 219/343 |
| 4,942,058 A | 7/1990 | Sano | 427/431 |
| 4,993,358 A | 2/1991 | Mahawili | 118/715 |
| 5,155,336 A | 10/1992 | Gronet et al. | 219/411 |
| 5,310,260 A | 5/1994 | Schietinger et al. | 374/142 |
| 5,317,492 A | 5/1994 | Gronet et al. | 362/294 |
| 5,366,002 A | 11/1994 | Tepman | 165/1 |
| 5,453,124 A | 9/1995 | Moslehi et al. | 118/715 |
| 5,487,127 A | 1/1996 | Gronet et al. | 392/416 |
| 5,487,787 A | 1/1996 | Cann et al. | 118/723 |
| 5,490,728 A | 2/1996 | Schietinger et al. | 374/7 |
| 5,531,835 A | 7/1996 | Fodor et al. | 118/728 |
| 5,566,744 A | 10/1996 | Tepman | 165/80.1 |
| 5,788,778 A * | 8/1998 | Shang et al. | 134/1 |
| 5,814,365 A * | 9/1998 | Mahawili | |
| 5,916,455 A * | 6/1999 | Kumagai | 216/88 |
| 5,948,168 A * | 9/1999 | Shan et al. | 118/723 R |
| 6,225,745 B1 * | 5/2001 | Srivastava | 438/711 |
| 6,263,831 B1 * | 7/2001 | Gorin | 118/723 |
| 6,283,130 B1 * | 9/2001 | Tamura | 134/1.1 |

FOREIGN PATENT DOCUMENTS

| | | |
|---|---|---|
| FR | 2715168 | 7/1995 |
| JP | 56-102577 | * 8/1981 |
| JP | 5139881 | 6/1993 |
| JP | 964307 | 3/1997 |
| JP | 969504 | 3/1997 |
| JP | 9219295 | 8/1997 |
| JP | 1187253 | 3/1999 |

OTHER PUBLICATIONS

Search Report on European Patent Application No. EP 00 65 0147, which corresponds to U.S. patent application Ser. No. 09/488,309.

* cited by examiner

Primary Examiner—George A. Goudreau
(74) Attorney, Agent, or Firm—Van Dyke, Gardner, Linn & Burkhart, LLP (57) ABSTRACT

A reactor for processing a semiconductor substrate includes a reactor housing which defines a processing chamber, and at least one gas injecting assembly. The processing chamber is adapted to support a semiconductor substrate therein. The gas injection assembly injects at least one gas into the processing chamber and onto the substrate and is adapted to ionize the gas injection into the processing chamber to increase the reactivity of the gas with the substrate to thereby enhance the processing of the semiconductor substrate. In preferred form, the gas is ionized into a gas plasma. For example, the gas injection assembly may include a gas plasma generator which ionizes the gas with an electromagnetic field. Preferably, the gas plasma generator ionizes the gas exteriorly of the processing chamber to isolate the substrate from the plasma generator. The gas injection assembly further includes one or more injection tubes, preferably quartz tubes, with each tube including a plurality of orifices through which the ionized gas is delivered into the processing chamber.

42 Claims, 5 Drawing Sheets

REACTOR WITH REMOTE PLASMA SYSTEM AND METHOD OF PROCESSING A SEMICONDUCTOR SUBSTRATE

BACKGROUND AND TECHNICAL FIELD OF THE INVENTION

The present invention relates to a processing reactor and, more particularly, to a processing reactor for the thermal processing and chemical deposition of thin film applications on a substrate, such as a semiconductor wafer, in which chemical reactants are excited prior to injection into the reactor's processing chamber to provide better control of the substrate processing conditions and, further, to enable new semiconductor device applications.

Several processing steps of semiconductor substrates involve chemical reactions at elevated temperatures. Heretofore, control of the deposition and annealing processes has been achieved by controlling the gas flow and pressure and, further, the wafer temperature. Various methods have been developed for measuring the temperature of a substrate during processing in order to improve the control of the various processes. For example, commonly assigned U.S. Pat. No. 5,814,365 discloses an improved reactor and heater which heats the substrate uniformly and, further, which provides for a temperature measurement device that enhances the control of the heating process to enhance the various semiconductor processes, including film deposition and etching, annealing, heat treating, and the like, and an improved gas injector which further enhances the control of the various processes. The disclosure of U.S. Pat. No. 5,814,365 is incorporated by references herein in its entirety. However, the elevated temperatures associated with the thermal processing and chemical deposition processes sometimes limit the device application and, further, may cause instability in already deposited films.

Consequently, there is a need for a processing reactor which can deliver reactant gases in a manner to enhance the deposition process and, further, in a manner to reduce the processing temperature so as to enable new device applications and retain the stability of already deposited films.

SUMMARY OF THE INVENTION

The present invention provides a processing reactor with an improved gas injection system. The gas injection system permits reduced process temperatures and, further, enhances the rate of deposition in some applications. In addition, the gas injection system enables new device applications in the processing reactor.

In one form of the invention, a reactor for processing a semiconductor substrate includes a reactor housing, which defines a processing chamber and is adapted to support a semiconductor substrate, and at least one gas injection assembly. The gas injection assembly injects at least one gas into the processing chamber and onto the substrate and is adapted to ionize the gas injected into the processing chamber to increase the reactivity of the gas with the substrate to thereby enhance the processing of the semiconductor substrate.

In one aspect, the gas injection assembly includes a plasma generator which ionizes the gas into a gas plasma. Preferably, the plasma generator ionizes the gas exteriorly of the processing chamber to isolate the substrate from the plasma generator. In preferred form, the plasma generator generates an electromagnetic field for ionizing the gas into the gas plasma.

In another aspect, the gas injection assembly includes a gas injection tube for delivering the ionized gas into the processing chamber. The injection tube preferably includes a plurality of orifices through which the ionized gas is delivered into the processing chamber. In preferred form, the gas injection tube comprises a quartz tube. In further aspects, the gas injection assembly further includes a plasma generator for ionizing the gas into gas plasma. The injection tube injects the ionized gas from the generator into the processing chamber. In preferred forms, the gas injection assembly further includes a supply tube in communication with the injection tube, which delivers gas to the injection tube. The plasma generator ionizes the gas into a gas plasma in the supply tube. Preferably, the plasma generator includes a generator tube in communication with the supply tube and generates an electromagnetic field in the generator tube to ionize the gas flowing into the supply tube into the gas plasma. For example, the supply tube may have a larger diameter than the generator tube such that the gas undergoes dissociation and ionization within the supply tube.

In other aspects, the gas injection assembly includes at two gas injection tubes, with one of the gas injection tubes injecting a first gas into the processing chamber and a second of the gas injection tubes injecting a second gas into the processing chamber. The gas injection assembly ionizes at least one of the gases into a gas plasma for injection into the processing chamber.

According to another form of the invention, a reactor for processing a semiconductor substrate includes a reactor housing, which defines a processing chamber and is adapted to support a substrate in the processing chamber, a plasma generator for ionizing at least one gas into a gas plasma, and at least one gas injector for injecting the ionized gas into the processing chamber and onto the substrate for processing the substrate.

In one aspect, the plasma generator includes a generator tube and a coil which induces an electromagnetic field in the generator tube to ionize the gas flowing through the generator tube with the generator tube directing the ionized gas into the gas injector for injecting into the processing chamber.

In other aspects, the housing includes a cover with a gas injector being supported in the cover. Preferably, the plasma generator is supported by the cover exteriorly of the processing chamber to isolate the substrate from the plasma gas generator.

In other aspects, the reactor includes at least two gas injectors for injecting at least one gas into the processing chamber. Preferably, the gas injectors are isolated from each other to avoid contamination.

In another form of the invention, a method of processing a semiconductor substrate includes providing a processing chamber, supporting the substrate in the processing chamber, ionizing a gas and injecting the ionized gas into the processing chamber under the substrate for processing the semiconductor substrate.

Preferably, the gas is ionized into a gas plasma, for example by applying an electromagnetic field, such as a radio frequency field, to the gas. In other aspects, the substrate may be cleaned with the ionized gas.

As will be understood, the reactor of the present invention provides numerous advantages over the prior known reactors. By ionizing the reactant gases, the gases are more reactive with the semiconductor substrate. As a result, the temperatures normally associated with processing such substrates can be significantly reduced. With reduction in processing temperatures, the stability of already deposited films can be retained and, furthermore, new device applications can be achieved. These and other objects, advantages, purposes and features of the invention will become more apparent from the study of the following description taken in conjunction with the drawings.

DESCRIPTION OF THE PREFERRED EMBODIMENTS

Figure 1:
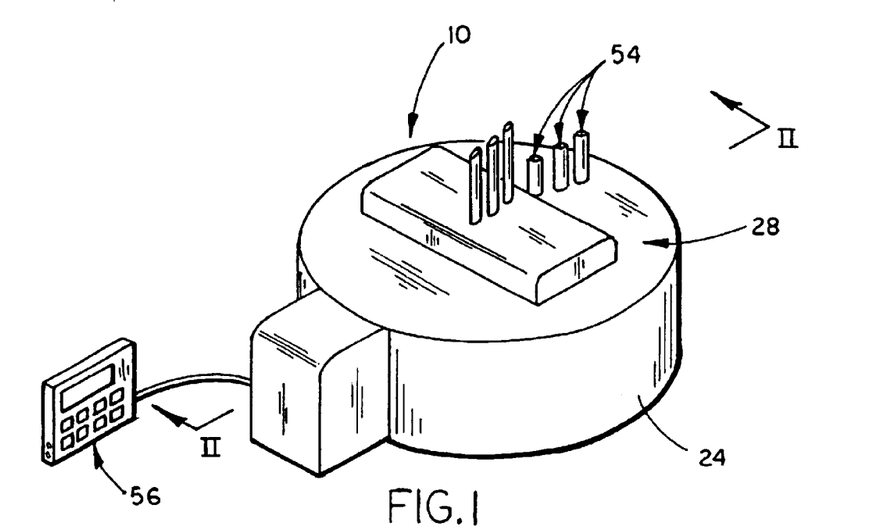
FIG. 1 is a perspective view of a reactor with a remote plasma generator system of the present invention.

Referring to. FIG. 1, the numeral 10 generally refers to a reactor of the present invention for processing semiconductor substrates. Reactor 10 is suitable for performing various fabrication and treatment processes on a semiconductor substrate 12, such as a semiconductor wafer, including thermal processing, for example thermal annealing, thermal re-flow of boro-phosphorous gases, and further chemical vapor deposition of thin film applications, such as oxide films, nitride films, doped and undoped polysilicon films, silicon epitaxial and tungsten metal and tungsten silicide films and the like, in the fabrication of semiconductor devices. As will be described in more detail below, reactor 10 includes a gas injection system 16 which injects reactant gases into the reactor's processing chamber 18 for processing a substrate 12. Gas injection system 16 includes a plasma generator 14 for raising the level of energy of the reactant gases preferably prior to injection into chamber 18. Plasma generator 14 preferably ionizes reactant gases for injection into the reactor's processing chamber 18 and, more preferably, ionizes the reactant gases into a plasma, which relaxes the electron temperature and reduces the heating, and in some applications eliminates the heating, associated with most chemical vapor deposition processes. In addition, by ionizing the reactant gases, the stability of already deposited films is enhanced. Furthermore, as will be more fully described below, plasma generator 14 is preferably located outside reactor and ionizes the reactant gas or gases before injection into the reactor thus isolating the semiconductor substrate from the high electron energy of the plasma field which prevents changes to the substrate, such as device damage and/or failure that typically occurs when the substrate is exposed to such high electron energy.

Figure 2:
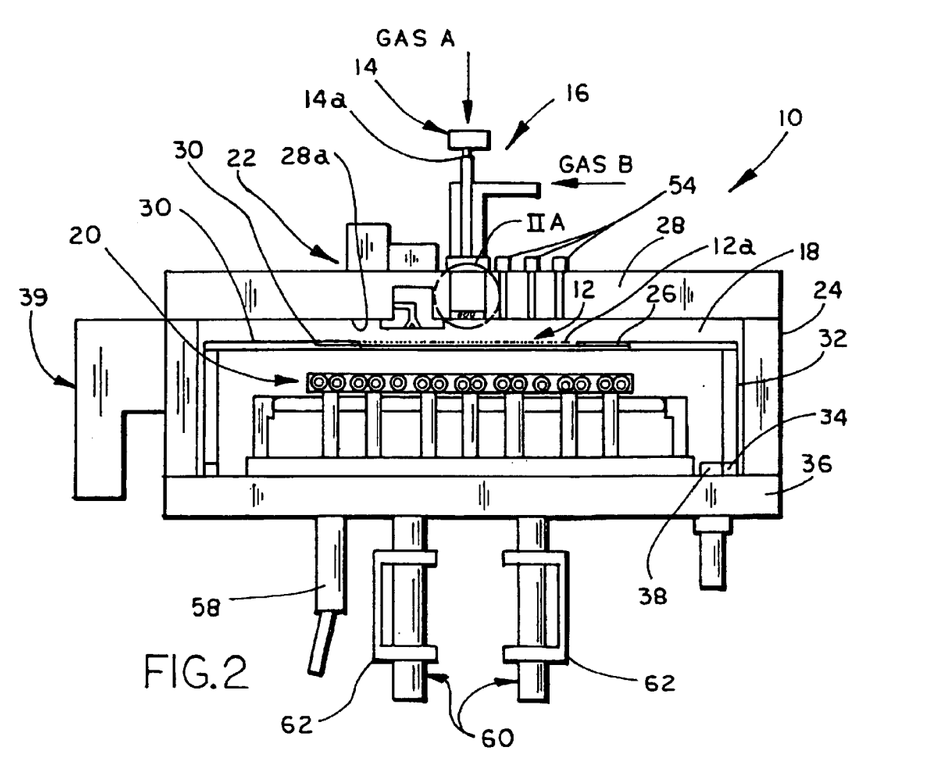
FIG. 2 is a cross-section taken along line II—II of FIG. 1.

As best seen in FIG. 2, reactor 10 includes a heater assembly 20, which delivers heat to the substrate, preferably in a uniform manner, and an emissivity measurement assembly 22 which permits continuous emissivity measurement of the average surface area of the device side of the substrate during processing so that the amount and/or profile of the heat being delivered to the substrate during processing may be adjusted. For details of one preferred heater, reference is made to U.S. Pat. No. 5,951,896, which is commonly assigned to Micro C Technologies, Inc. of Grand Rapids, Mich., the entire disclosure of which is incorporated by reference herein in its entirety.

Referring again to FIG. 2, reactor 10 includes a housing 24 which forms processing chamber 18. Substrate 12 is supported in processing chamber 18 on a platform 26 which is made from a suitable material, such as silicon carbide coated graphite, quartz, pure silicon carbide, alumina zirconia, aluminum, steel, or the like, and is oriented with a device side 12a directed toward an upper wall or cover 28 of housing 24. For details of examples of preferred embodiments of platform 26, reference is made to pending U.S. Patent Applications entitled: A SUBSTRATE PLATFORM FOR A SEMICONDUCTOR SUBSTRATE DURING RAPID HIGH TEMPERATURE PROCESSING AND METHOD OF SUPPORTING A SUBSTRATE, filed on Aug. 15, 1997, Ser. No. 08/912,242; and A PLATFORM FOR SUPPORTING A SEMICONDUCTOR SUBSTRATE AND METHOD OF SUPPORTING A SUBSTRATE DURING RAPID HIGH TEMPERATURE PROCESSING, now U.S. Pat. No. 6,007,635, by Imad Mahawili, commonly assigned to Micro C Technologies of Grand Rapids, Mich., the disclosures of which are incorporated herein by reference in their entireties.

Platform 26 is preferably seated and supported in a recessed central opening 30a provided in a top wall 30 of a second rotatable housing 32. Housing 32 is preferably rotatably supported in housing 24 on a base 34. Base 34 and second housing 32 are rotatably supported on base wall 36 of housing 24 and are preferably rotated using a conventional magnetically coupled drive mechanism 38 or other suitable driving devices which can apart rotation to base 34 through a vacuum seal. In this manner, substrate 12 is rotated to provide a uniform application of heat and reactant gases over its entire surface, as would be understood by those skilled in the art. The revolutions per minute (rpm) of base 34 and housing 32 may be preset, for example preferably in a range of 5 to 60 rpm depending on the specific process, again is understood by those skilled in the art.

In preferred form, heater assembly 20 is completely enclosed by housing 32 and platform 26, which when placed on top of housing 32 completes the enclosure of heater assembly 20, Platform 26 can accommodate various substrate sizes, for example, substrates with diameters ranging from 150 to 300 mm and greater. Platform 26 supports substrate 12 spaced from lower surface 28a of cover 28 with the space therebetween forming process chamber 18. Process chamber 18 is preferably evacuated through a vacuum exhaust port provided in gas injector assembly 16, as will be more fully described below. Preferably, substrate 12 is placed into evacuated chamber 18 through a chamber valve 39 and is placed on platform 26 by a conventional wafer transport device (not shown), such as an automatic transport robot as is known in the art.

Figure 2A:
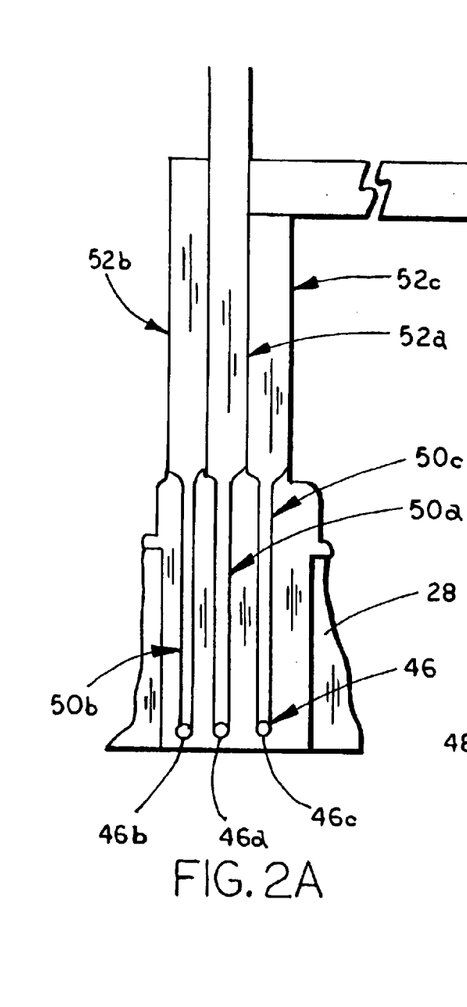
FIG. 2A is an enlarged cross-section of the section designated IIA—IIA in FIG. 2.
Figures 4, 5:
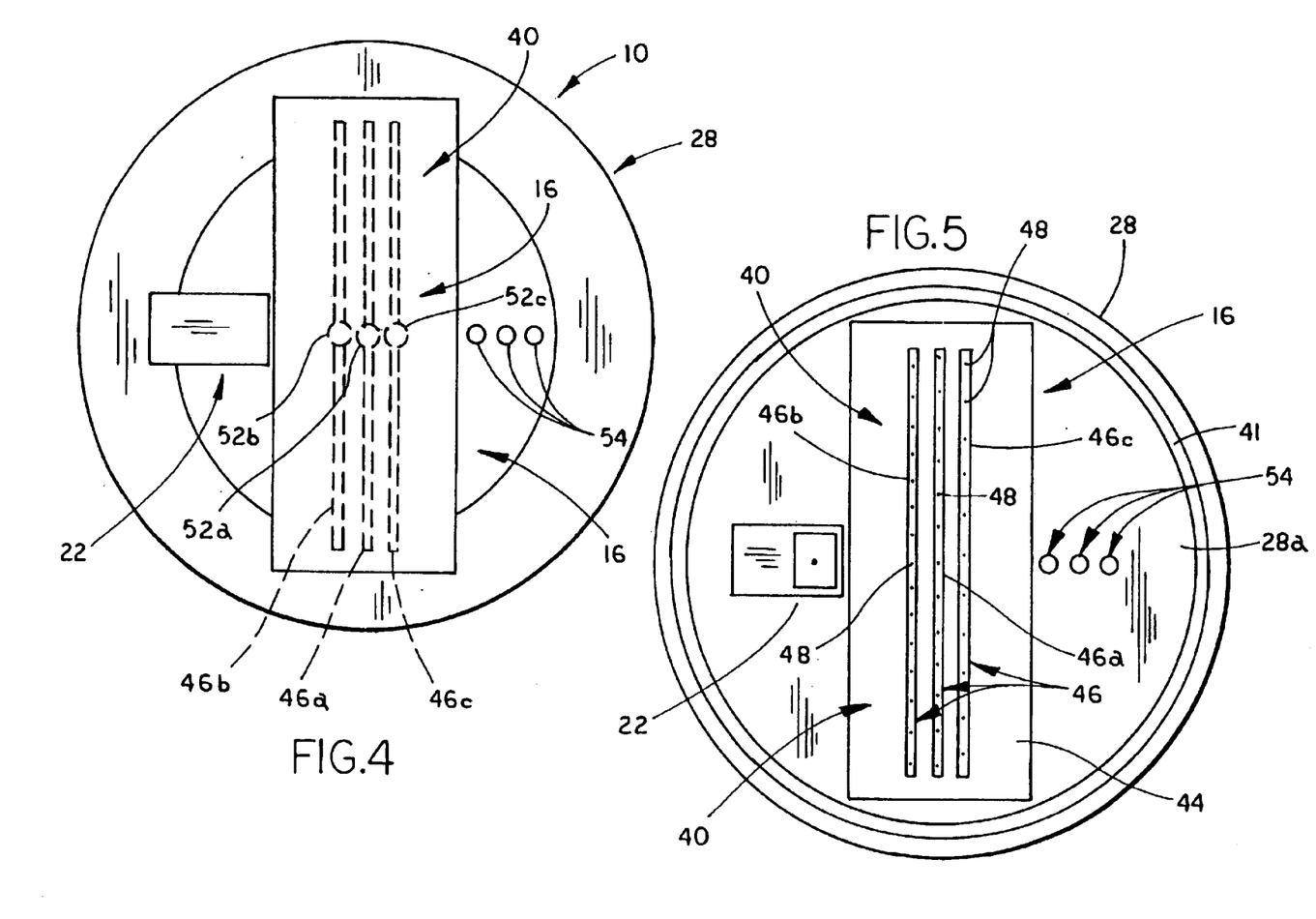
FIG. 4 is an enlarged top plan view of a cover of the reactor of FIG. 1.
FIG. 5 is an enlarged bottom plan view of the cover of FIG. 4.

Referring to FIGS. 4 and 5, gas injection assembly 16 includes manifold 40 through which one or more gases are injected onto substrate 12. As best seen in FIG. 2A, manifold 40 is formed from a plurality of gas injection tubes 46 which are arranged in a spaced relationship to extend over substrate 12 and are supported in cover 28. Preferably, tubes 46 comprises non-reactive gas tubes, for example quartz or alumina tubes or the like. As a result, the particulate contamination in chamber 18 is significantly reduced with the elimination of metal welds in the gas injection system. In preferred form, each gas injection tube 46 is isolated from the adjacent injection tube and is aligned in a similar fashion to the channels described in commonly owned U.S. Pat. No. 5,814,365, so that manifold 40 injects the gas or gases onto localized or discrete regions of the substrate wherein thin film deposition takes place. Furthermore, each tube 46 is preferably removably supported in cover 28 so that one or more tubes 46 may be removed for cleaning or replacement.

Gas injection manifold 40 may be also assembled as a module which is positioned and supported in cover 28 so that the entire module can be removed as well as the individual tubes. Manifold 40 also includes a gas injection ring 41, which extends around tubes 46 and an exhaust manifold 44, which similarly extends around tubes 46 radially inwardly of inner gas injection ring 41. Injection ring 41 is typically used to inject an inert gas, such as nitrogen or the like, into processing chamber 18 and directs the inert gas to the perimeter of the substrate to form a gas barrier so that when reactive gases are injected through gas injection tubes 46 the reactive gases are confined to an area of the substrate directly below the respective tubes 46 due to the placement of the vacuum exhaust manifold 44 being adjacent the gas injection tubes 46. Exhaust manifold 44 extends along and is adjacent gas injection tubes 46 so that any stray gas molecules which migrate near the region under exhaust manifold 44 will be exhausted from processing chamber 18. Therefore, the gas or gases introduced by gas injection tubes are confined to a discrete volume of processing chamber 18 and, further, to a discrete area of substrate 12.

Figure 3:
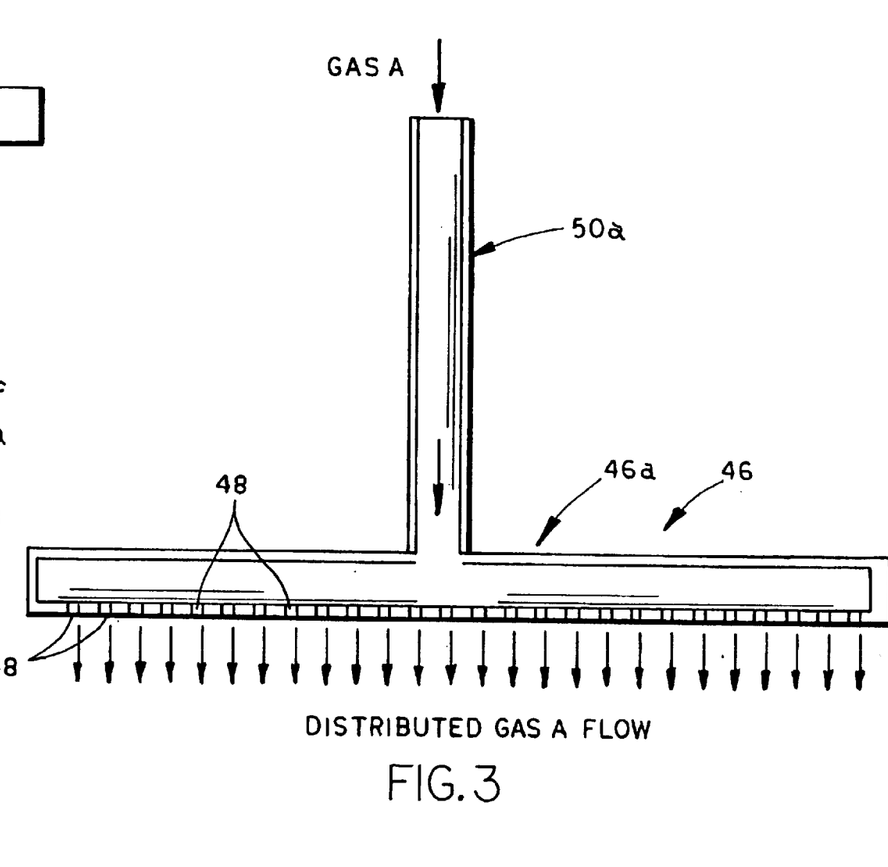
FIG. 3 is an enlarged view of a gas injector tube of the reactor of FIG. 2.

Referring to FIGS. 2A and 3, each tube 46 includes a plurality of orifices or holes 48, which may be formed, for example, by drilling, such as laser drilling, for directing or dispersing the respective gas in the tube onto the substrate 12. The size, location, and pitch of each orifice or hole may be varied as described to vary the flow of the gas and, further, may be varied along the length of tube 46 to adjust the profile of the injected gas to optimize gas distribution over substrate 12. Preferably, the profile of the flow of the gas is desired to direct less gas to the center of the substrate than to the regions toward the perimeter of the substrate, as described in U.S. Pat. No. 5,814,365. In this manner, tubes 46 function similar to a sprinkler. Referring again to FIG. 2A, manifold 40 preferably includes three tubes, a central tube 46a and two outer tubes 46b, 46c. Optionally, each tube 46a, 46b, or 46c may inject a respective gas, such as a respective reactant gas, onto substrate 12. For example, a first reactant gas may be injected through central tube 46a, and a second reactant gas may be injected by tubes 46b and 46c. Depending on the application, the flow through each tube may be individually controlled so that they can all turn on together, be sequenced one tube after another, or a random sequence with various time intervals between each on/off cycle. Furthermore, as reactive gases are turned off from one tube, an inert gas may be injected into the tube to control the reaction conditions at the surface of the wafer and to prevent any back flow contamination of the reactants. Furthermore, each of the respective tubes 46a, 46b, 46c may be associated with an injection of a specific gas. It should be understood by those skilled in the art that a wide variety of gases can be employed and selectively introduced through the orifices 48, for example hydrogen, argon, tungsten, hexaflouride, or the like to process substrate 12.

Referring to FIG. 3, each tube 46a, 46b, 46c includes or is in communication with a delivery tube 50a, 50b, 50c, respectively, which extends from tubes 46a, 46b, 46c through cover 28. Each delivery tube 50a, 50b, or 50c is preferably coupled in series to a larger diameter supply tube 52a, 52b, or 52c, respectively, which is positioned outside chamber 18 and above cover 28. For example, tubes 50a, 50b, 50c, 46a, 46b, 46c, may each have a diameter of approximately 0.25 inches with tubes 46a, 46b, and 46c having orifice hole diameters of about 0.20 inches. Supply tubes 52a, 52b, and 52c each have a diameter in a range of 0.5 inch to 1 inch or larger. When a gas is fed through this center gas injector tube at reduced chamber pressures, for example below 1 Torr and typically in a range of 0.1 to 0.3 Torr, and simultaneously the plasma generator is energized, the gas undergoes dissociation and ionization within the larger confines of the larger quartz tube. Supply tubes 52a, 52b, and 52c are also preferably formed from non-reactive material, such as quartz or alumina, and deliver ionized gases to tubes 46a, 46b, 46c by way of tubes 50a, 50b, 50c and, preferably, deliver gas ionized into a plasma, as will be more fully described below.

As best seen in FIG. 5, gas injection manifold 40 includes an exhaust manifold 44. As described above, exhaust manifold 44 extends around tubes 46a, 46b, 46c to provide an additional boundary beyond which the reactive gases can not extend. In addition to removing unreacted gases from the processing chamber 18, exhaust manifold 44 also assists in the prevention of back flow contamination of the reactant gases. In combination with injection ring 41, exhaust manifold 44 controls the film deposition on substrate 12 in a manner which results in localized area film deposition and, further, permits use of any emissivity measurement system described below.

In preferred form, the gas or gases injected into chamber 18 are ionized before injection so that the energy level in the gas is raised prior to injection into chamber 18. In preferred form, the plasma generator 14 is mounted exteriorly of the reactor to isolate the high electron energy from the plasma field from reaching the substrate being processed in the reactor. By isolating the plasma field, this system prevents changes in the substrate from occurring due to high electron energy which can cause device decay and failure. Plasma generator 14 produces an electromagnetic field through which the reactant gases flow before entering supply tubes 52a, 52b, or 52c. Optionally, one or all the gases may be ionized before injection into chamber 18. Generator 14 includes a tuned cavity, such as a microwave cavity, that surrounds a tube 14a which is inserted into the respective supply tube 52a, 52b, or 52c. Plasma generation is affected by using a microwave generator with a suitable electrical matching network. This high frequency alternating power is supplied to the tuned cavity that surrounds tube 14a, which is preferably made of quartz or aluminum material, and in which the gas to be excited is flowing. At certain power, the flowing gas atoms become excited and even ionized depending on the power input. Excited and ionized gas atoms are then directed rapidly onto the wafer using the quartz or aluminum tubing distributor. Once the excited gas species enters the chamber, the species react either with another gas in the chamber and/or with the silicon wafer surface itself. Once the gas passes through plasma generator 14 and enters supply tubes 52a, 52b, and 52c, which preferably provide an enlarged passage, the respective gas ionizes and dissociates and, most preferably, ionizes into a gas plasma. As a result, the gas being injected into chamber 18 is more reactive with the semiconductor substrate, for example silicon, germanium, or gallium arcinide and, further, the process temperatures required to achieve thin film deposition is reduced. For example:

EXAMPLE 1

When non-ionized silane and oxygen is injected into a conventional reactor chamber at 300 mTorr and 400° C. onto a silicon wafer, the reaction rate is typically about 150 Angstroms per minute. When a plasma of silane and oxygen is injected under these same process conditions in reactor chamber 18, the rate of deposition is in excess of 1,500 angstroms per minute.

EXAMPLE 2

The film deposition rate of silane and ammonia at 400 mTorr and 750° C. can be achieved at around 400° C. if the reactant gases are ionized into a plasma.

EXAMPLE 3

When pure oxygen gas is injected at elevated temperatures of 900° to 1,100° C., a silicon wafer can be ionized into silicon dioxide. When oxygen plasma is injected into reactor 10, silicon dioxide can be formed at the surface of a silicon wafer at temperatures as low as room temperature. Alternately, higher growth rates can be achieved when oxygen plasma is injected into chamber 18 onto a silicon wafer at or near 400° C., which is well below the 1,100° C. thermal processing conditions associated with non-ionized oxygen.

In addition to reducing the temperature requirements for film deposition, by injecting reactant gases in plasma form, already formed devices will not be exposed to the higher temperatures associated with the further film depositions and, therefore, will remain stable. Further, the injection of gases in plasma form enables new device applications, for example:

EXAMPLE 4

Nitrogen gas does not react with a bare silicon wafer even when injected at temperatures of 1,150° C. When nitrogen is injected in plasma form into chamber 18 onto a silicon wafer, a very thin film of silicon nitride is formed at room temperature. This deposition reaction is even further enhanced when the nitrogen is ionized using a helium plasma.

EXAMPLE 5

When a fluorine containing compound, for example hydrogen Freon, $NF_3$, or $XeF_2$ or the like is excited into a plasma and injected into the chamber of reactor 10 onto a silicon wafer, the excited fluorine ions can be used to etch the wafer isotropically from native oxide or deposited oxide.

As a result, the exited fluorine ions can be used as a very effective wafer pre-cleaning and post-deposition cleaning application. Furthermore, for example, the use of $XeF_2$ as an etchant permits pre-cleaning, etching, simultaneous etching during deposition and post-cleaning to be done at room temperature, for example 25° C.

EXAMPLE 6

Using the present reactor, hydrogen plasma can be used at various temperatures for water-surface cleaning or "pre-cleaning" for preparing the surface for gate oxide quality growth.

When the gas being injected is oxygen, then low temperature silicon dioxide of high quality can be formed on a pre-cleaned silicon wafer. When this is subsequently followed by the injection of nitrogen in place of the oxygen, the formed dioxide surface can then be nitrided at near room temperature. This process paves the way for the formation of advanced semiconductor gate dielectrics.

EXAMPLE 7

Using the present reactor and plasma generator, when ammonia is ionized into a plasma and injected into the chamber and silane gas is also injected, for example, via tubes 46b, 46c, silicon nitride is grown at temperatures less than 750° C. (which is typically the minimum processing temperature for growing silicon nitride).

As noted above, reactor 10 preferably includes a non-contact emissivity measurement system 22 for measuring the emissivity and calculating the temperature of substrate 12 to one of the various fabrication processes. Emissivity measurement system 22 determines the temperature of substrate 12 by comparing the radiation emitted by a reference light source, which is preferably positioned in the chamber 18, with that of the radiation emitted by substrate 12. The reference light source preferably includes at least one lamp which is similar to construction to the lamps used in heater assembly 20, which are described in U.S. Pat. No. 5,951,896. Reference is made to U.S. Pat. No. 5,814,365 for further details of a preferred example of the emissivity measurement system 22.

Reactor 10 further includes a plurality of optical fiber temperature measurement probes 54 which are fixed to cover 28 and constantly collect photon density data emitted from the device side 12a of substrate device 12 during all processing conditions. The temperatures measured by probes 54 are sent to a main computer control to compare them to a set temperature and any deviation is computed and transformed into a control current to drive a standard off-the-shelf SCR current relay to deliver the proportional power to each of the lamp zones then the heater assembly 20. Preferably, reactor 10 includes three probes 54 which are positioned to measure the temperature of different parts of the wafer which assures temperature uniformity during the processing cycle.

Temperature readings of substrate 12 calculated by processing unit 56 are preferably used as input into a control system (not shown) which monitors and controls the output of heater assembly 20. The control system is coupled to heater assembly 20 through an electrical feed through 58 which extends through the base wall 36 of reactor housing 24. In order to maintain the vacuum in reactor 10, feed through 58 is sealed by an O-ring or sealed using other conventional sealing devices or methods.

After semiconductor substrate 12 has been processed, substrate 12 is lifted off platform 26 by a plurality of lifter pins 60 which protrude through platform 26 and lift substrate 12 off platform 26 for automatic loading and unloading of substrate 12 within reactor 10. Lifter pins 60 are raised and lowered by magnetically coupled wafer lifters 62 which are conventionally known in the art. Pins 56 are centrally located in housing 24 and project through a central portion of the heater assembly 20 and through a central portion of platform 26. Similarly, to maintain the vacuum in chamber 18 lifter pins 54 extend through O-ring seals provided in the base wall 36 of housing 24.

Figure 6:
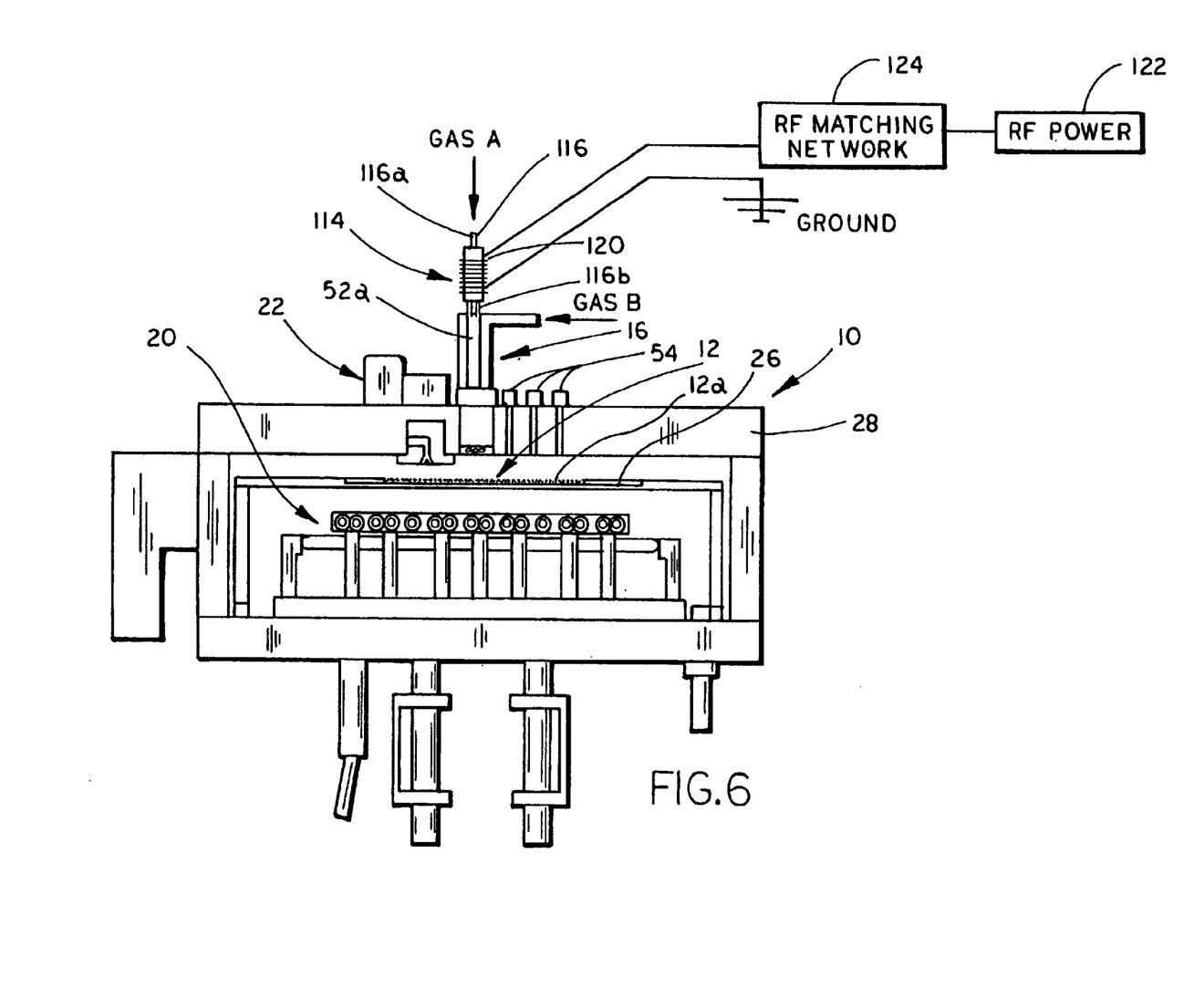
FIG. 6 is a similar view to FIG. 2 illustrating a second embodiment of the remote plasma generator system of the present invention.
Figure 7:
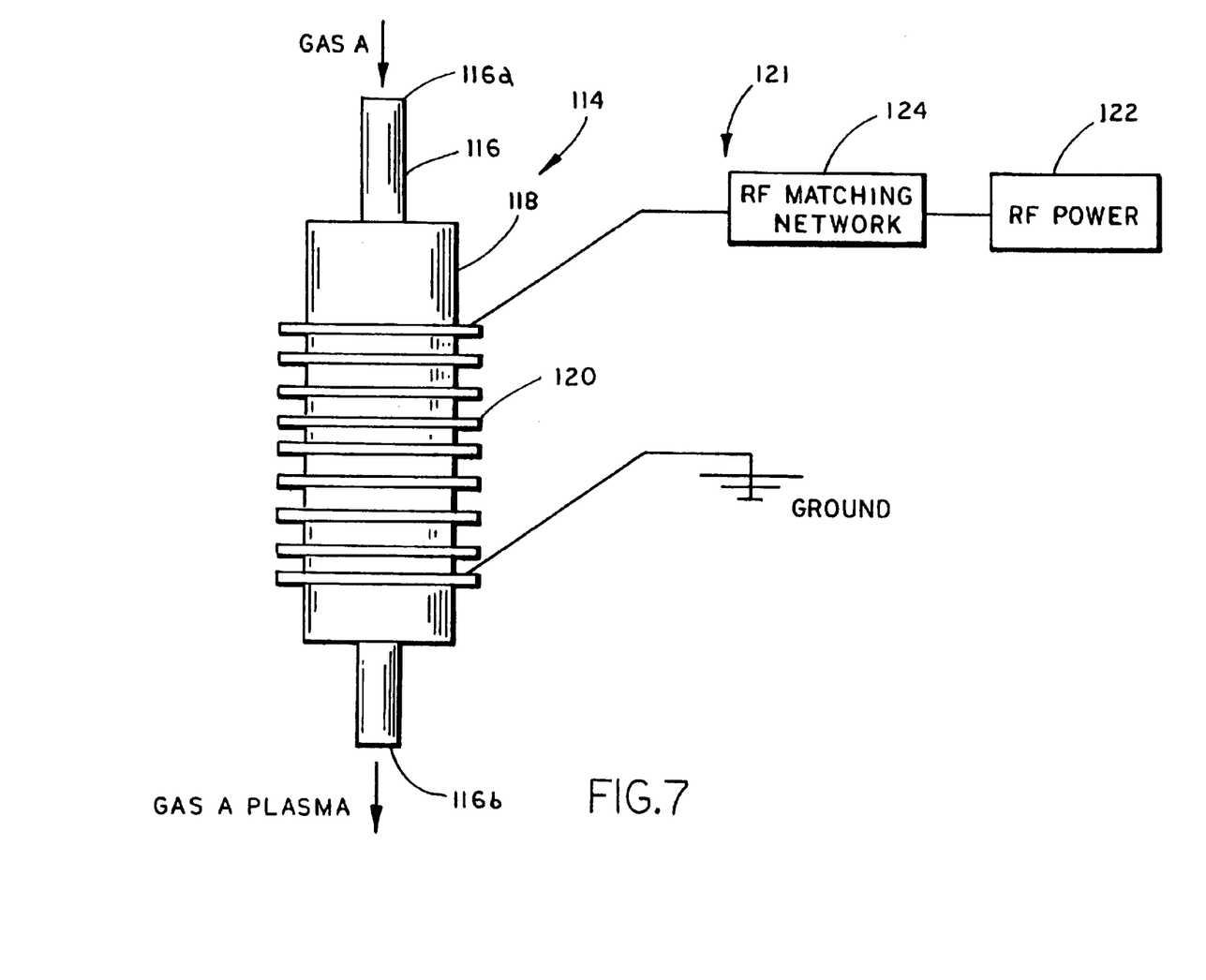
FIG. 7 is an enlarged view, of the remote plasma generator system of FIG. 6.

Referring to FIG. 6, reactor 10 includes an electromagnetic field plasma generator 114. Generator 114 includes a generator tube 116, sleeve 118 which extends around generator tube 116, and a coil 120 which extends around sleeve 118. Sleeve 118 preferably comprises a water-cooled sleeve to provide cooling for coil 120. Coil 120 is grounded on one end and electrically coupled to a drive circuit 121. Drive circuit 121 includes a power source 122, such as a radio frequency (RF) power source or a microwave power source, and an impedance matching network 124. For example, where power source 122 comprises an RF power source, power source 122 may have a frequency of 13.56 MHZ, and supply power preferably in a range of about 800–1200 watts and, more preferably, about 1000 watts. Coil 120 is preferably a copper coil with a diameter, for example, of about 0.15 inch and is wound around sleeve 120 between about 2 and 20 turns and, more preferably, about 7 turns.

As best seen in FIG. 6, generator tube 116 includes an input end 116a and an output end 116b, with output end 116b being inserted into a respective supply tube 52a, 52b, or 52c. When gas is injected into input end 116a of generator tube 116, power supply 122 is energized and coil 120 generates an electromagnetic field within generator tube 116. At a given power, the gas undergoes dissociation and ionization with the confines of the larger supply tube 52a, 52b, or 52c. These "excited" gas species are then fed into chamber 18 and impinge onto substrate 12. Depending on the chemical nature of the gas fed into chamber 18 via center tube 46a and outer tubes 46b and 46c, numerous processes can be achieved as described in the examples above.

Thus, this remote plasma generator supplies energy to the gas being used to process the substrate in order to raise the energy of the gas such that the gas is ionized into a plasma form. Such energetic species then become more chemically active and, as a result, lead to lowering the process temperatures required for the formation of semiconductor thin films with almost total isolation of the plasma generator or electric field from the wafer that is being processed. By isolating the high electron energy associated with the plasma field from reaching the semiconductor substrate being processed in the reactor's processing chamber, the remote plasma system prevents changes in the semiconductor substrate during processing such as device damage and/or failure; This new quartz gas injection system may include one or more features as the reactor described in U.S. Pat. No. 5,814,365, with the added benefit of injecting gases ionized into a plasma form and, further, the benefit of being able to remove and replace each of the gas injection quartz tubes with ease. This design also significantly reduces particulate contamination. Numerous other chemical reactions and film deposition and etching can be employed using this technique of remote plasma activation in this novel chamber design. In addition, while reference is made to processing semiconductor substrates, this novel reactor with the remote plasma system and processes of the present invention may be used to process other substrates. Furthermore, deposited films can be quickly annealed or heat treated at elevated temperature insitu due to the high temperature capabilities of the heater power technology provided in the reactor.

For the purposes of the following description, the terms "top" or "bottom" and derivatives or equivalents thereof shall relate to the invention as oriented in FIGS. 1 to 7. It is understood that the invention may assume various alternative-orientations and configurations, except where expressly specified to the contrary. It is also understood that the specific dimensions, configurations, devices and methods illustrated in the attached drawings, and described in the preceding specification, are simply exemplary embodiments of the inventive concepts defined in the appended claims. Hence, specific dimensions and other physical characteristics relating to the embodiments disclosed herein are not to be considered limiting unless the claims expressly state otherwise.

Accordingly, the present invention provides a reactor chamber which injects reactant gases that have been transformed into a gas plasma to enhance the processing of the substrate. Furthermore, the reactor chamber delivers and controls the flow of ionized gases to the substrate during the processing so that the substrate receives a uniform deposition of thin film of the process gas or gases.

While several forms of the invention have been shown and described, other forms will now be apparent to those skilled in the art. For example, other generators may be used to ionize one or more of the reactant gases. Furthermore, the remote plasma system of the present invention may be used in other reactors. Therefore, it will be understood that the embodiments shown in the drawings and described above are merely for illustrative purposes only, and are not intended to limit the scope of the invention which is defined by the claims which follow.

I claim:

1. A reactor for processing a semiconductor substrate, said reactor comprising:

a reactor housing defining a processing chamber and being adapted to support the substrate in said processing chamber;

a plasma generator for ionizing at least one gas into a gas plasma;

at least one gas injector, said gas injector being adapted to inject the ionized gas into said processing chamber and onto the substrate supported therein for processing the substrate, wherein said housing includes a cover, said gas injector being supported in said cover;

a heater for selectively heating the substrate in said processing chamber; and a heater housing supported in said reactor housing and enclosing said heater therein.

2. The reactor according to claim 1, wherein said plasma generator generates an electromagnetic field, said electromagnetic field for ionizing the gas into a gas plasma.

3. The reactor according to claim 1, wherein said plasma generator ionizes said gas exteriorly of said processing chamber to isolate the substrate from said electromagnetic field.

4. The reactor according to claim 1, wherein said gas injector comprises a quartz tube.

5. The reactor according to claim 1, wherein said plasma generator is supported by said cover exteriorly of said processing chamber to isolate the substrate from the plasma generator.

6. The reactor according to claim 1, wherein said at least one gas injector comprises at least two gas injectors for injecting at least one gas into said processing chamber.

7. The reactor according to claim 6, wherein said gas injectors are isolated from each other to avoid contamination.

8. The reactor according to claim 7, wherein one of said gas injectors is adapted to inject a first gas into said processing chamber, and another of said injectors is adapted to inject a second gas into said processing chamber.

9. The reactor according to claim 8, wherein said plasma generator ionizes at least one of the first and second gases into a gas plasma for injection into the processing chamber.

10. The reactor according to claim 8, further comprising a heater for heating the substrate in said processing chamber.

11. A reactor for processing a semiconductor substrate, said reacter comprising:

a reactor housing defining a processing chamber and being adapted to support the substrate in said processing chamber;

a plasma generator for ionizing at least one gas into a gas plasma; and at least one gas injector, said gas injector being adapted to inject the ionized gas into said processing chamber and onto the substrate supported therein for processing the substrate, wherein said housing includes a cover, said gas injector being supported in said cover, said gas injector including a plurality of orifices through which the ionized gas is delivered into said processing chamber.

12. The reactor according to claim 11, wherein said gas injector further includes a supply tube and an injection tube, said supply tube in communication with said injection tube, said supply tube for delivering gas to said injection tube, and said plasma generator for ionizing the gas into a gas plasma in said supply tube.

13. The reactor according to claim 12, wherein said plasma generator includes a generator tube in communication with said supply tube and generates an electromagnetic field in said generator tube to ionize the gas flowing into said supply tube into a gas plasma.

14. The reactor according to claim 13, wherein said supply tube has a larger diameter than said generator tube such that the gas undergoes dissociation and ionization within said supply tube.

15. The reactor according to claim 14, where said supply tube comprises a quartz tube.

16. The reactor according to claim 11, wherein said gas injector includes at least two gas injection tubes, one of said gas injection tubes injecting a first gas in said processing chamber, and a second of said gas injection tubes injecting a second gas in said processing chamber, and said gas injector ionizing at least one of said first and second gases into a gas plasma for injecting into said processing chamber.

17. The reactor according to claim 11, wherein said plasma generator includes a generator tube and a coil inducing an electromagnetic field in said generator tube to ionize the gas flowing through the generator tube, and said generator tube directing the ionized gas to said gas injector for injecting into said processing chamber.

18. The reactor according to claim 17, further comprising a supply tube in communication with said gas injector, said generator tube directing the gas into the supply tube.

19. The reactor according to claim 18, wherein said supply tube has a greater diameter than said generator tube such that the gas under goes dissociation and ionization in said supply tube.

20. A reactor for processing a semiconductor substrate, said reactor comprising:

a reactor housing defining a processing chamber and being adapted to support the substrate in said processing chamber;

a plasma generator for ionizing at least one gas into a gas plasma; and at least one gas injector, said was injector being adapted to inject the ionized gas into said processing chamber and onto the substrate supported therein for processing the substrate, wherein said gas injector comprises an elongate tube with a plurality of orifices through which the gas is injected into said processing chamber.

21. The reactor according to claim 20, wherein said orifices are uniformly spaced along said elongate tube.

22. The reactor according to claim 20, wherein said plasma generator generates an electromagnetic field, said electromagnetic field for ionizing the gas into a gas plasma.

23. The reactor according to claim 22, wherein said plasma generator ionizes said gas exteriorly of said processing chamber to isolate the substrate from said electromagnetic field.

24. The reactor according to claim 23, wherein said housing includes a cover, said elongate tube being supported in said cover.

25. The reactor according to claim 20, wherein said plasma generator includes a generator tube in communication with said gas injector, said plasma generator generating an electromagnetic field in said generator tube to ionize the gas flowing to said gas injector into a plasma.

26. A reactor for processing a semiconductor substrate, said reactor comprising:

a reactor housing defining a processing chamber and being adapted to support the substrate in said processing chamber;

a plasma generator for ionizing at least one gas into a gas plasma;

at least one gas injector, said gas injector being adapted to inject the ionized gas into said processing chamber and onto the substrate supported therein for processing the substrate, wherein said housing includes a cover, said gas injector being supported in said cover, said at least one gas injector comprising at least two gas injectors for injecting at least one gas into said processing chamber, said gas injectors being isolated from each other to avoid contamination, wherein one of said gas injectors is adapted to inject a first gas into said processing chamber, and another of said gas injectors being adapted to inject a second gas into said processing chamber; and a heater for heating the substrate in said processing chamber, wherein said heater is enclosed in a heater housing, said heater housing being supported in said reactor housing.

27. The reactor according to claim 26, wherein said heater selectively heats the substrate in said processing chamber.

28. The reactor according to claim 26, wherein said heater housing provides support for the substrate in said reactor housing.

29. The reactor according to claim 26, wherein said heater housing is adapted for supporting the substrate in said processing chamber.

30. The reactor according to claim 29, wherein said heater housing is adapted for rotatably supporting the substrate in said processing chamber.

31. A reactor for processing a semiconductor substrate, said reactor comprising:

a reactor housing defining a processing chamber and having a substrate support for supporting a substrate in said processing chamber; and a gas injection system including an electromagnetic field generator generating an electromagnetic field exteriorly of said processing chamber and for injecting at least one gas into said processing chamber, said gas injection system passing said at least one gas through said electromagnetic field generated by said electromagnetic field generator wherein said gas is ionized exteriorly of said processing chamber, said gas injection system injecting said ionized gas into said processing chamber and onto the substrate supported therein for processing the substrate, said gas injection system including a gas manifold, said substrate support being adapted to rotate said substrate in said processing chamber whereby said gas manifold distributes the ionized gas uniformly over the substrate, said gas injection system further including an injection tube and a supply tube in communication with said injection tube, said injection tube having a plurality of orifices through which the ionized gas is delivered in said processing chamber, said supply tube for delivering the ionized gas to said injection tube, wherein said supply tube has a larger diameter than said generator tube such that the gas undergoes dissociation within said supply tube.

32. The reactor according to claim 31, wherein said electromagnetic field generator comprises a plasma generator.

33. The reactor according to claim 31, wherein said electromagnetic field generator includes a generator tube in communication with said supply tube, said electromagnetic field generator generating said electromagnetic field in said generator tube to ionize gas flowing into said supply tube into a gas plasma.

34. The reactor according to claim 31, wherein said gas injection tube comprises a quartz tube.

35. The reactor according to claim 31, where said supply tube comprises a quartz tube.

36. The reactor according to claim 31, wherein said gas injection assembly includes at least two gas injection tubes, one of said gas injection tubes injecting a first gas in said processing chamber, and a second of said gas injection tubes injecting a second, gas in said processing chamber, and said gas injection assembly ionizing at least one of said first and second gases into a gas plasma for injecting into said processing chamber.

37. The reactor according to claim 31, wherein said plasma generator includes a generator tube and a coil inducing an electromagnetic field in said generator tube to ionize the gas flowing through the generator tube, and said generator tube directing the ionized gas to said gas injector for injecting into said processing chamber.

38. The reactor according to claim 31, wherein said orifices are uniformly spaced along said elongate tube.

39. The reactor according to claim 31, wherein said housing includes a cover, said gas injector being supported in said cover.

40. The reactor according to claim 31, further comprising a heater for heating the substrate in said processing chamber.

41. The reactor according to claim 31, wherein said heater is enclosed in a heater housing, said heater housing being supported in said reactor housing.

42. The reactor according to claim 31, wherein said heater housing provides support for the substrate in said reactor housing.

* * * * *

UNITED STATES PATENT AND TRADEMARK OFFICE
CERTIFICATE OF CORRECTION

PATENT NO. : 6,783,627 B1
APPLICATION NO. : 09/488309
DATED : August 31, 2004
INVENTOR(S) : Imad Mahawili, Ph.D.

Page 1 of 1

It is certified that error appears in the above-identified patent and that said Letters Patent is hereby corrected as shown below:

Column 3:
Line 25, Delete --,-- after "view".
Line 30, Delete --.-- after "to".

Column 4:
Line 46, "," should be --.-- after "20".

Column 7:
Line 44, Insert --,-- after "HeF2".

Column 9:
Line 34, ";" should be --.--.

Column 10:
Line 60, Claim 11, "reacter" should be --reactor--.

Column 11:
Line 50, Claim 20, "was" should be --gas--.
Line 54, Claim 20, "clongate" should be --elongate--.

Signed and Sealed this

Fifteenth Day of August, 2006

JON W. DUDAS
*Director of the United States Patent and Trademark Office*